US00RE40532E

(19) United States
(12) Reissued Patent
Willer et al.

(10) Patent Number: US RE40,532 E
(45) Date of Reissued Patent: Oct. 7, 2008

(54) NON-VOLATILE MEMORY CELL AND FABRICATION METHOD

(75) Inventors: Josef Willer, Riemerling (DE); Franz Hofmann, München (DE); Armin Kohlhase, Neubiberg (DE); Christoph Ludwig, Langebrück (DE)

(73) Assignee: Qimonda Flash GmbH, Dresden (DE)

(21) Appl. No.: 11/034,444

(22) Filed: Jan. 11, 2005

Related U.S. Patent Documents

Reissue of:
(64) Patent No.: 6,734,063
Issued: May 11, 2004
Appl. No.: 10/200,423
Filed: Jul. 22, 2002

(51) Int. Cl.
*H01L 21/336* (2006.01)
*H01L 29/94* (2006.01)

(52) U.S. Cl. ..... 438/257; 257/390; 257/391; 257/E21.66

(58) Field of Classification Search ..... 438/257; 257/390, 391, E21.662
See application file for complete search history.

(56) References Cited

U.S. PATENT DOCUMENTS 4,698,900 A 10/1987 Esquivel
5,051,796 A 9/1991 Gill
5,763,309 A 6/1998 Chang
5,817,552 A * 10/1998 Roesner et al. ..... 438/241
6,229,169 B1 * 5/2001 Hofmann et al. ..... 257/296
6,255,167 B1 * 7/2001 Wu ..... 438/259
6,881,994 B2 * 4/2005 Lee et al. ..... 257/296
2002/0028541 A1 * 3/2002 Lee et al. ..... 438/149

FOREIGN PATENT DOCUMENTS

EP 1 043 769 A1 10/2000
EP 1 365 452 A2 11/2003
WO WO 01/43186 A1 6/2001

OTHER PUBLICATIONS

S. Aritome, et al.: "A 0.67 mm2 Self–Aligned Shallow Trench Isolation Cell (SA–STI Cell) For. 3V–only 256Mbit NAND EEPROMs", IEDM 94–61, pp. 3.6.1–3.6.4.
Colinge, J.P.: "Silicon–on–insulator Technology: Materials to VLSI", Kluwer Academic Publishers, 2$^{nd}$ edition, 1997, pp. 123–192.*
Skotnicki, T.: "Nano CMOS", 3$^{rd}$ European Workshop on Ultimate Integration of Silicon–ULIS 2002.*
Eitan, B. et al.: "NROM: A Novel Localized Trapping, 2–Bit Nonvolatile Memory Cell", IEEE Electron Device Letters, vol. 21, No. 11, Nov. 2000, pp. 543–545.*

* cited by examiner

*Primary Examiner*—Long K. Tran
(74) *Attorney, Agent, or Firm*—Laurence A. Greenberg; Werner H. Stemer; Ralph E. Locher

(57) ABSTRACT

Memory cell transistors with back-channel isolation are produced without using an SOI substrate. With the word line stack acting as a mask, the semiconductor material is etched on both sides of the world line, first anisotropically and then isotropically to widen the etch hole and form an undercut beneath the gate electrode and at a distance from the ONO storage layer forming the gate dielectric. The undercut is filled, whereby a buried oxide layer of at least 20 nm maximum thickness is formed underneath the channel region. The latter is p-doped at a density of at least $10^{17}$ $cm^{-3}$.

16 Claims, 6 Drawing Sheets

NON-VOLATILE MEMORY CELL AND FABRICATION METHOD

Matter enclosed in heavy brackets [ ] appears in the original patent but forms no part of this reissue specification; matter printed in italics indicates the additions made by reissue.

BACKGROUND OF THE INVENTION

FIELD OF THE INVENTION

The invention lies in the field of electrically writable and erasable non-volatile flash memories comprising NROM-type memory cells preferably arranged in a virtual-ground NOR array.

Extremely small non-volatile memory cells are required for very large-scale integration densities in multimedia applications. However, while the minimum feature size, which is determined by lithography, continues to decrease, other parameters can no longer be scaled accordingly.

NROM-type memory cells are described in B. Eitan et al., "NROM: A novel localized trapping, 2-Bit nonvolatile memory cell", IEEE Electron Device Letters 21, 543–545 (2000). Currently, NROM cells are fabricated as planar-type MOS transistors using a triple layer of oxide-nitride-oxide both as gate dielectric and as memory or programming layer. The intermediate nitride layer is used as a storage layer for trapping charge carriers, preferably electrons. Due to the specific properties of the used materials, typical source/drain voltages of 4 V to 5 V are necessary during program and erase operations.

At these comparatively high voltages, a punch-through occurs that impedes further scaling down of transistor channel lengths to values below 200 nm. Punching is supposed to take place between the $n^+$-junctions of the source/drain regions through the semiconductor material below the channel region. Recent research in the physics of semiconductor devices demonstrated a superior punching behavior as well as an improvement of short channel properties when the channel is confined below by a buried oxide layer at a certain distance from the gate electrode.

MOSFETs on SOI substrates are described in the book by Jean-Pierre Colinge, "Silicon-on-insulator Technology: Materials to VLSI", $2^{nd}$ ed., Kluwer Academic Publishers, Dordrecht 1997, Chapter 5: "The SOI MOSFET". The vertical extension of the channel region of SOI MOSFETs is limited by the insulating layer of the SOI substrate. The channel is partially or fully depleted, depending on the thickness of the channel region, which determines, inter alia, whether the space-charge regions adjacent to the gate-oxide and adjacent to the insulating layer are separated or join each other. The SOI MOSFET is completely electrically insulated towards the bulk substrate, unless there is a via provided through the insulating layer so that the bulk substrate can be electrically contacted from the upper surface.

At the $3^{rd}$ European Workshop on Ultimate Integration of Silicon (ULIS 2002), Munich 2002, Thomas Skotnicki presented a NANO CMOS with 16 nm gate length. This type of transistor structure provides a backside channel isolation that is essentially confined to the channel region and is formed by removing an about 15 nm thick epitaxially grown SiGe layer and substituting it with electrically insulating material. The vertical dimension of the undoped and fully depleted channel is comparable to state of the art SOI MOSFETs. The heavily doped source and drain regions extend below the insulating layer level and are provided with LDD (lightly doped drain) regions as channel junctions. The channel structure is called SON, Silicon On Nothing.

SUMMARY OF THE INVENTION

It is accordingly an object of the invention to provide a non-volatile memory cell and a fabrication method which overcome the above-mentioned disadvantages of the heretofore-known devices and methods of this general type and which provide for a SONOS-type transistor memory cell having a minimum cross-sectional area of the active channel, at the same time allowing for an at least partial depletion of the channel region, and a method of producing such a memory cell and memory cell array.

It is a further object of the invention to disclose a method of fabricating NROM memory cells without using SOI substrates.

It is a yet a further object to provide an isolation of the memory cell that is self-aligned to the word line and suitable for an array of memory cells.

It is still a further object of the invention to provide an isolated channel transistor memory cell that can be arranged in a virtual-ground array, and a method of producing such a memory cell and memory cell array.

With the foregoing and other objects in view there is provided, in accordance with the invention, a method of producing a non-volatile memory cell having a semiconductor structure (a semiconductor body or a semiconductor layer on a substrate); buried bit lines formed at the surface of the semiconductor structure and conductor strips on the surface applied to the bit lines; a source region and a drain region each connected by one of the bit lines; a gate dielectric formed on the surface at least between the source region and the drain region; a gate electrode disposed on the gate dielectric; and a word line electrically connected to the gate electrode, the word line crossing the bit lines and being electrically insulated from the bit lines.

The method comprises the following steps:

a) providing a semiconductor structure;

b) depositing a gate dielectric comprising a storage layer for trapping charge carriers;

c) depositing a layer for forming the gate electrode;

d) forming openings in the layer and forming spacers at sidewalls in the openings;

e) implanting a dopant through the openings to form the buried bit lines;

f) applying the conductor strips onto the buried bit lines, and applying electrically insulating cover layers onto the conductor strips;

g) applying at least one word line layer electrically connecting the gate electrode, and applying a hard mask layer on top of the at least one word line layer, the hard mask layer being used to structure the gate electrode and the at least one word line layer to form a word line stack;

h) etching on both sides of the word line stack between the bit lines anisotropically down into the semiconductor structure to a level below the source region and the drain region to form etch holes that are self-aligned to the word line stack; and i) filling the etch holes with an electrically insulating material.

The NROM cell according to this invention is arranged at the surface of a semiconductor body or semiconductor layer supplied with electrically insulating regions extending vertically with respect to this surface straight down into the semiconductor body or semiconductor layer between bit lines and on both sides of a corresponding word line provided for addressing the memory cell, the electrically insulating regions being arranged self-aligned to the word line and possibly also self-aligned to the bit lines and extending at least to a lower boundary level of the source region and the drain region. The electrically insulating regions preferably comprise an undercut region or buried layer underneath the channel region that is situated between the regions of source and drain. Punching of the transistor is avoided or at least impeded by means of the electrically insulating regions.

The structure is produced by anisotropically etching between the word lines and bit lines after word line delineation at least to the level of the lower junctions of the source/drain regions and preferably by isotropically underetching the channel region of the transistor. This etching process takes place from both sides of the word line and is performed self-aligned to the word line. The etch holes and eventually the undercut are filled with the electrically insulating material. The gate reoxidation step can be used to grow a thermal oxide around the transistor body and to passivate the semiconductor surface. Additionally, boron dopant or another p-dopant species can be implanted for improved electrical insulation beneath the electrically insulating material filling the undercut.

A preferred embodiment comprises a deposition of a CVD oxide in combination with a dielectric material of a small value of the relative dielectric constant into the space between neighboring word lines.

The method is applicable to future memory devices appertaining to lithography generations with a word line half pitch of about 90 nm and less.

The method according to the invention of producing a non-volatile memory cell comprises the following steps: A storage layer is applied on a surface of a semiconductor body or semiconductor layer, and a layer provided for a gate electrode is applied on this storage layer. In the regions provided for the bit lines, openings are etched in the gate electrode layer and used to implant a dopant to form buried bit lines comprising regions for source and drain. Bit line stacks are applied on the buried bit lines to reduce the electrical resistance of the bit lines and are covered with an electrically insulating material. A word line crossing the bit lines and electrically connected to the gate electrode is applied and structured together with the gate electrode to form a word line stack. A number of bit lines arranged in parallel and word lines crossing there bit lines can be applied in the described manner to form a whole cell array of a memory device.

The word line stack is used as a mask to etch the semiconductor material on both sides of the world line, first anisotropically and, in a preferred embodiment, subsequently isotropically to widen the etch hole and form an undercut beneath the gate electrode and at a distance from the storage layer. The undercut is filled with an electrically insulating material, particularly oxide, to form an insulating buried layer, having a maximum thickness, i.e., a maximum dimension in the direction orthogonal to the surface of the semiconductor body or semiconductor layer, of at least 20 nm, in some embodiments more than 100 nm, underneath the channel region.

The source/drain regions are preferably of n-type conductivity, whereas the channel is of p-type conductivity. The channel is preferably doped at a density of at least $10^{17}$ $cm^{-3}$. The threshold voltage of the cell transistor can be set to values between 0.5 V and 2.0 V in the erased state, and can be adjusted to typically about 1.5 V by a suitable choice of the device parameters.

An accomplishment of the inventive method is to provide a non-volatile cell transistor with isolated channel without using an SOI substrate. It provides means to reduce the effective channel length of the cell device, especially with the aim of further scaling down the device dimensions. An electrical insulation between the source region and the drain region laterally or immediately beneath the channel impedes a punch-through in this area.

With the above and other objects in view there is also provided, in accordance with the invention, a non-volatile memory cell, comprising:

a semiconductor structure selected from the group consisting of a semiconductor body and a semiconductor layer and having a surface;

buried bit lines formed at the surface of the semiconductor structure and conductor strips on the surface applied to the bit lines;

a source region and a drain region each connected by one of the bit lines;

a gate dielectric formed on the surface at least between the source region and the drain region, the gate dielectric including a storage layer for trapping charge carriers;

a gate electrode disposed on the gate dielectric;

a word line electrically connected to the gate electrode, the word line crossing the bit lines and being electrically insulated from the bit lines; and electrically insulating regions extending into the semiconductor structure between the bit lines and on both sides of the word line, the electrically insulating regions being self-aligned to the word line and extending at least to a lower boundary level of the source region and the drain region.

In accordance with an added feature of the invention, the electrically insulating undercut region extends continuously across the word line.

In accordance with an additional feature of the invention, the electrically insulating undercut region has a maximum thickness in a direction orthogonal to the surface of the semiconductor structure of at least 20 nm or of at least 100 nm.

In accordance with a concomitant feature of the invention, there is provided a channel region between the source region and the drain region. The channel region has a preferred doping density of at least $10^{17}$ $cm^{-3}$.

Other features which are considered as characteristic for the invention are set forth in the appended claims.

Although the invention is illustrated and described herein as embodied in a non-volatile memory cell and method of fabricating such a memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the following, a detailed description of the preferred embodiments of the invention will be given referring to the steps of preferred methods of manufacture. In any of the embodiments, the fabrication process can start with steps that are known in themselves from the fabrication process of memory cells according to the state of the art. These steps may comprise depositing layers of pad oxide and/or pad nitride grown on a surface of a semiconductor body or semiconductor layer, especially a p-doped semiconductor wafer. All the known steps to form oxide-filled shallow trench isolations can be added, including the application of lithography for trench definition, and planarization. Standard implants may be carried out to form wells in the periphery region provided for the CMOS control integrated circuits.

Next, the storage layer, preferably an ONO-layer (oxide-nitride-oxide layer), is grown on a surface of the semiconductor body or semiconductor layer. A lithography step can follow to remove the storage layer in the periphery and to replace it there by one or more different gate oxides. On the storage layer, an electrically conductive layer is deposited, which is provided for the gate electrode to be produced.

Figure 1A:
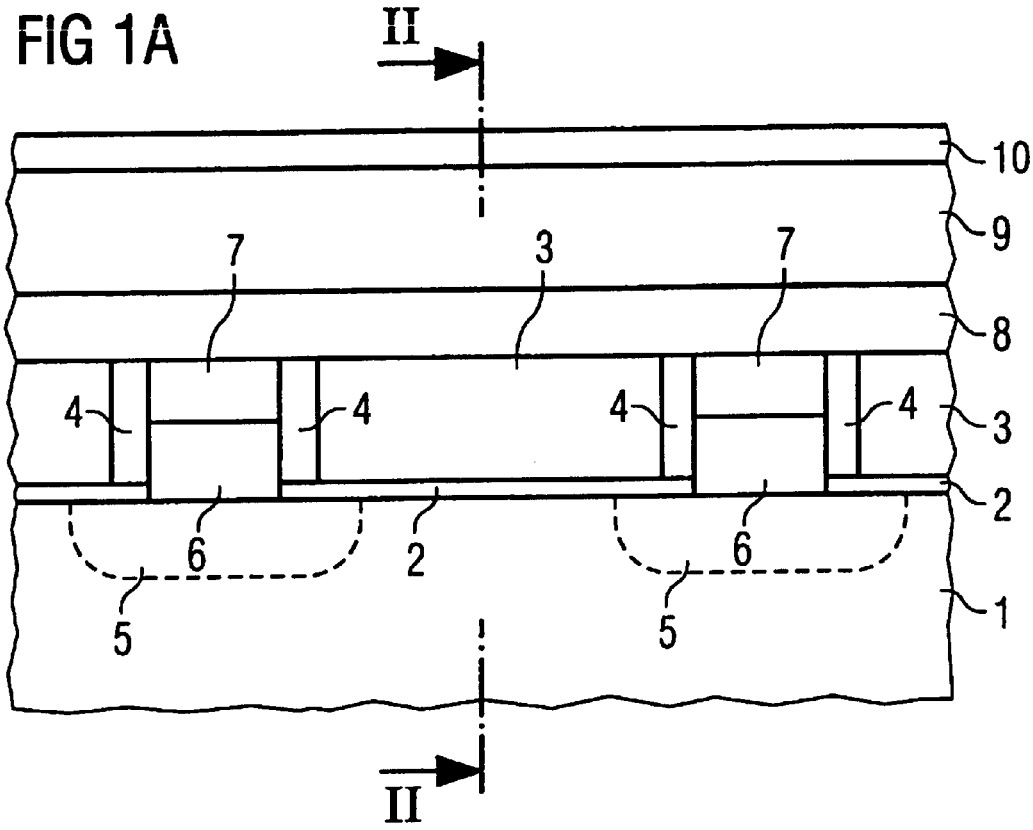
FIGS. 1A and 1B show cross-sections through the bit lines, taken along the line I—I in FIG. 2, after the first process steps of two alternative embodiments of the The method according to the invention.
Figure 1B:
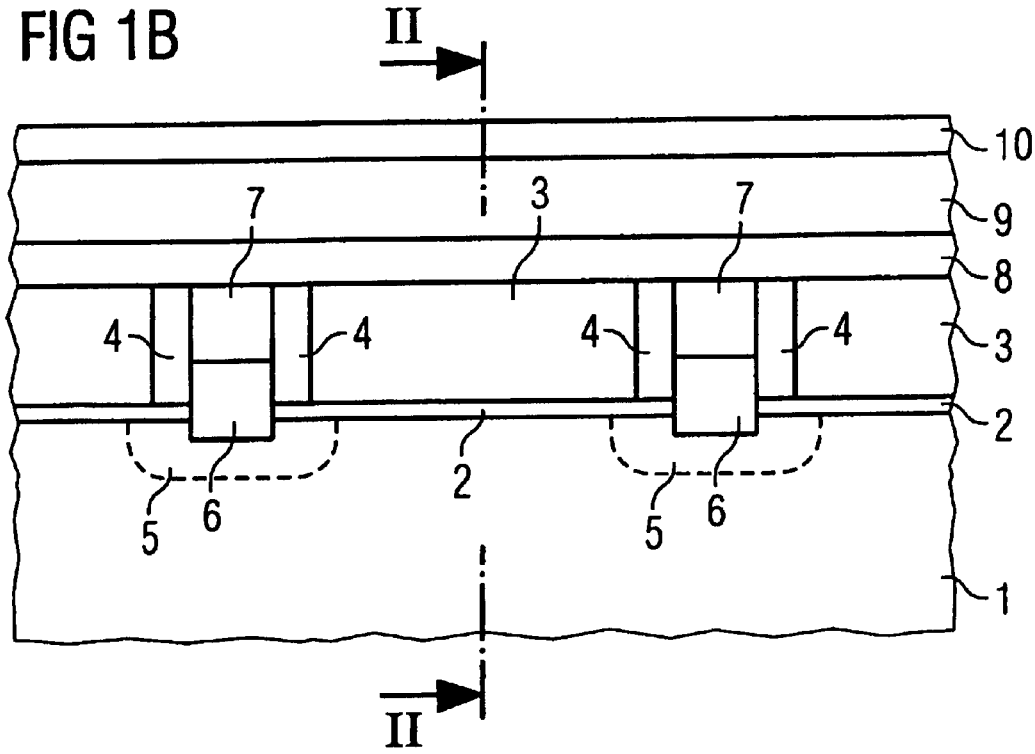

Referring now to the figures of the drawing in detail and first, particularly, to FIGS. 1A and 1B thereof, there are shown cross-sections through a semiconductor body 1 carrying the thin storage layer 2 and the gate electrode layer 3 that may be comprised of poly-crystalline silicon. A nitride layer is deposited as a hard mask layer. By a lithography step, bit line openings running parallel to each other at a given spacing distance are formed in the gate electrode layer 3. Spacers 4 are formed at the sidewalls of the gate electrode layer 3 within the openings. The spacers 4 are formed in the way that is known in itself from general semiconductor technology, by isotropically depositing a layer of the spacer material and subsequently anisotropically etching back this layer until only the sidewall spacers are left. The spacers 4 may be formed of oxide, preferably, or of nitride, especially silicon nitride. Then, dopant is implanted to form buried bit lines 5, of $n^+$-conductivity type in the described embodiment.

Bit line conductor strips 6 to reduce the electrical resistance are deposited on the surface of the buried bit lines 5. The bit line conductor strips 6 can be formed of CoSi and/or polysilicon. When using a silicide, the bit line conductor strips 6 can partly be merged into the semiconductor material of the semiconductor body 1 as shown in FIG. 1B. Bit line cover layers 7 are applied on the bit line conductor strips 6. These cover layers 7 can be formed by depositing TEOS (tetraethylorthosilicate) or by growing silicon oxide on top of the bit line conductor strips 6, if they were made of polysilicon. The cover layers 7 are planarized, and the hard mask layer of nitride is removed.

Next, a layer sequence is deposited that includes at least one word line layer provided for the formation of word lines. In the exemplary embodiment of FIGS. 1A and 1B, respectively, there are shown a first word line layer 8, for example polysilicon, a second word line layer 9, for example comprising a metal, and a hard mask layer 10 formed of an electrically insulating material. The cross-section indicated in FIGS. 1A and 1B in a position between two bit lines is shown in FIG. 2.

Figure 2:
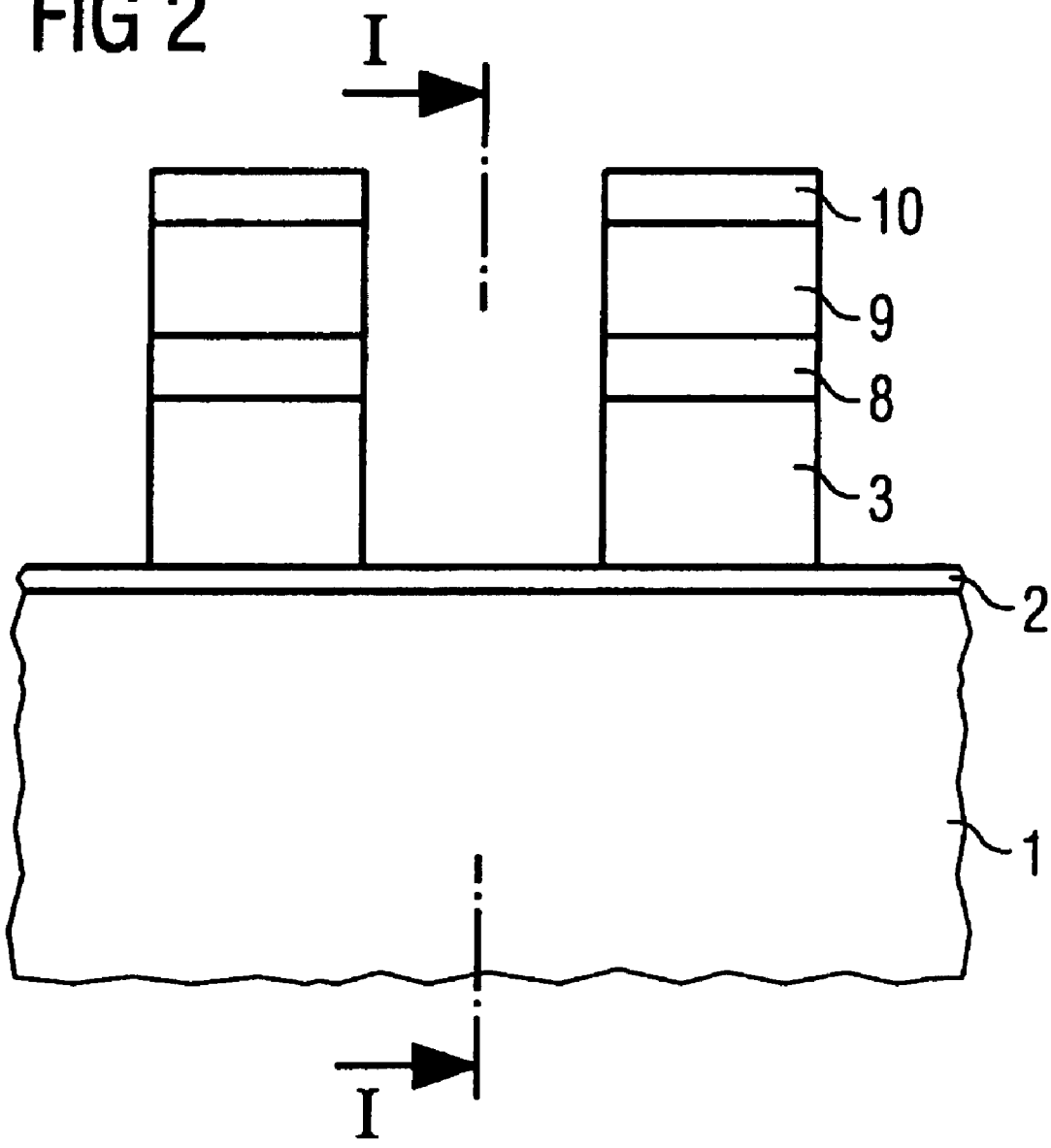
FIG. 2 shows the cross-section through the word lines taken along the lines II—II in FIGS. 1A and 1B.

FIG. 2 shows the cross-section indicated in FIGS. 1A and 1B through the word lines after formation of the word line stack. The first word line layer 8, the second word line layer 9, the hard mask layer 10, and the gate electrode 3 have been structured to form strips of word line stacks. The position of the cross-sections shown in FIGS. 1A and 1B is indicated in FIG. 2 by the broken line. The lithography step can be split into two steps to etch the word lines first while the periphery devices remain protected by the hard mask layer.

Figure 3A:
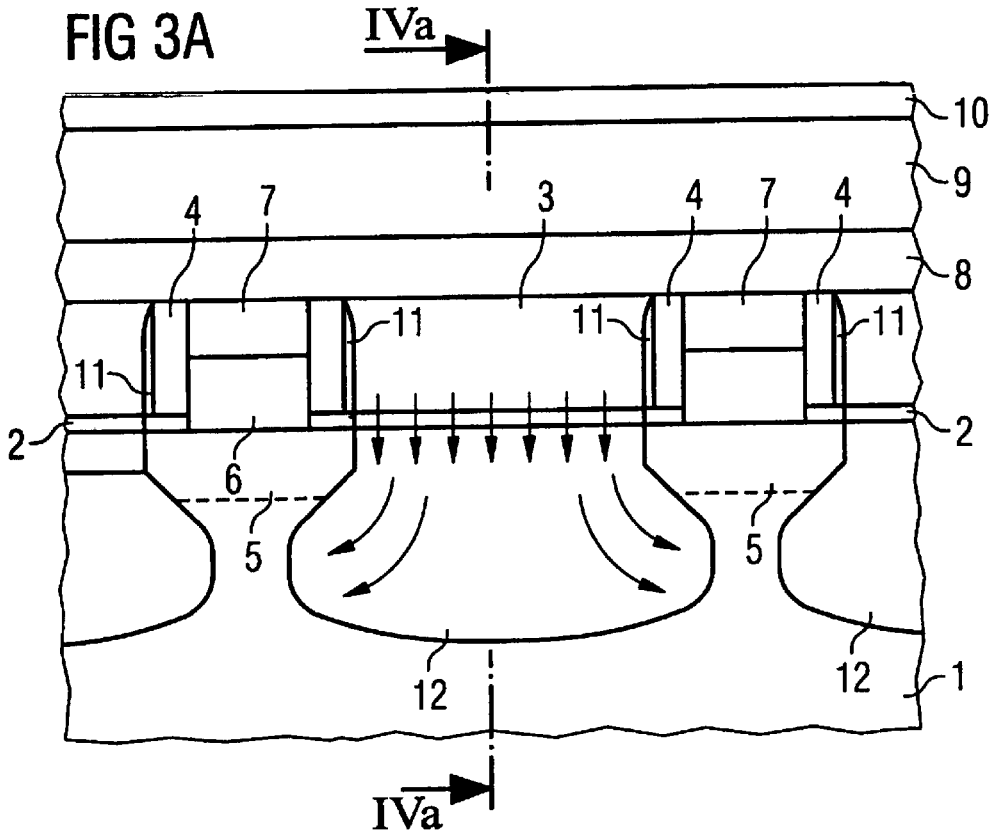
FIG. 3A is a cross-section through the bit lines, taken along the line IIIa—IIIa in FIG. 4A, after the formation of the underetch structures for a first alternative embodiment of the method.
Figure 3B:
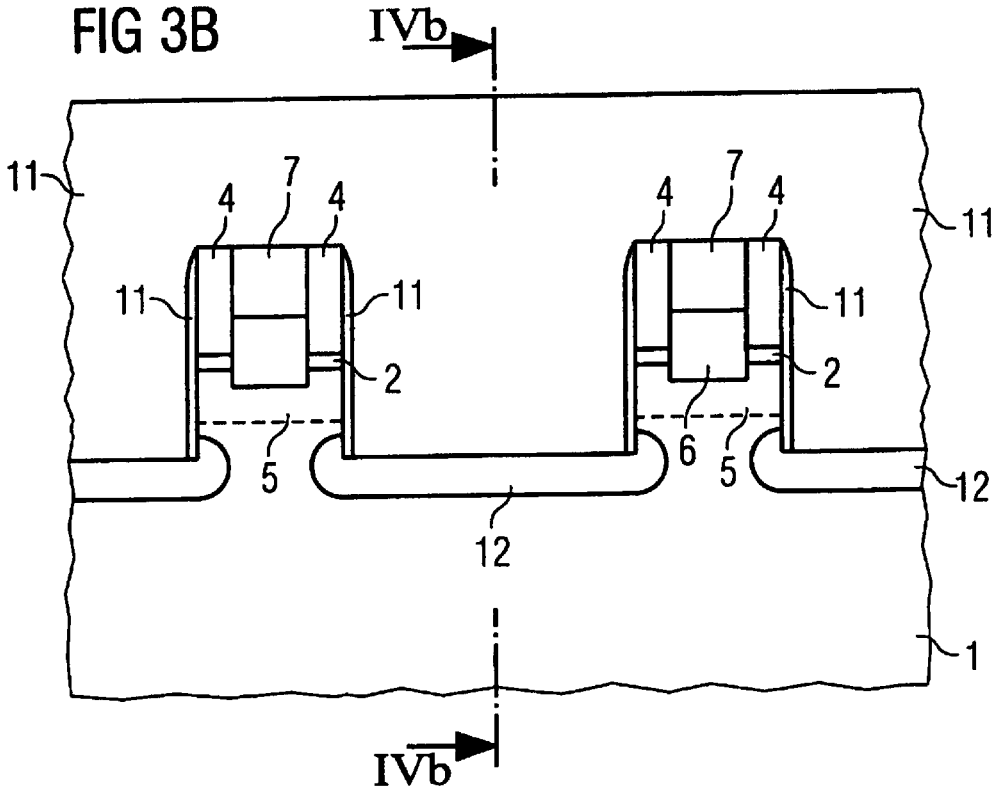
FIG. 3B is a cross-section through the bit lines, taken along the line IIIb—IIIb in FIG. 4B, after the formation of the underetch structures for a second alternative embodiment of the method.

As shown in the cross-sections of FIGS. 3A and 3B, the openings in the gate electrode layer are used to perform an etching step to form holes in a self-aligned fashion at least to the word lines, and in this example also self-aligned to the bit lines. In this step, RIE (reactive ion etching) can be used to etch anisotropically through the storage layer 2 and straight down into the semiconductor material. This is shown in FIG. 3A by the vertically oriented arrows pointing downwards. The holes are etched down at least to the level of the lower boundaries of the source/drain regions and the buried bit lines 5, i.e. to the level of the lower pn-junction between the source/drain/buried bitline region and the main semiconductor body or layer. By this, the semiconductor body or semiconductor layer is electrically insulated in a region adjacent to the transistor channel and vertically extending down as far as the source/drain regions.

After this anisotropic etching, the sidewalls of the bit line stacks and the word line stacks can be covered by a thin nitride cover 11. Alternatively, cover 11 can be a thin oxide layer resulting from a word line reoxidation step. The cover 11 is removed from the surface of the semiconductor body 1 at least at the bottom of the etched holes. In a preferred embodiment, the etching process continues isotropically by using either a dry etchant such as $SF_6$ or, in the embodiment of FIG. 3B, a wet etchant. In the embodiment of FIG. 3B, the sidewalls are protected by the cover 11, so that the underetched parts of the etch holes 12 are confined to a comparatively smaller vertical extension. The underetching of etch holes 12 achieved by the isotropic etching process can be further continued until the etch holes advancing from both sides of the word line meet and form one continuous opening underneath the channel region of the cell transistor.

Figure 4A:
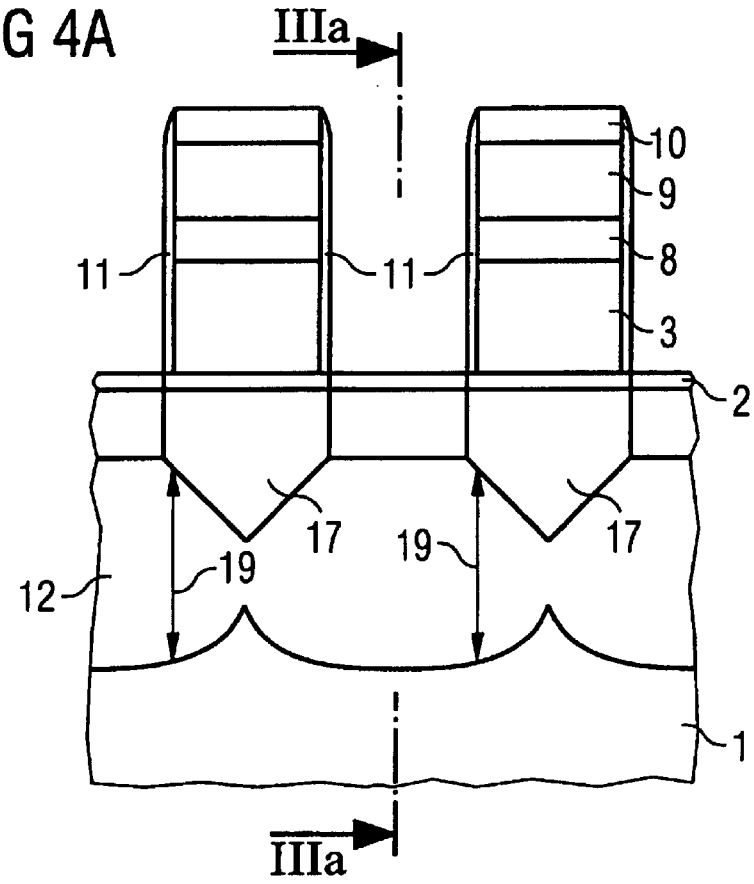
FIGS. 4A and 4B show cross-sections through the word lines as indicated in FIGS. 3A and 3B, respectively.
Figure 4B:
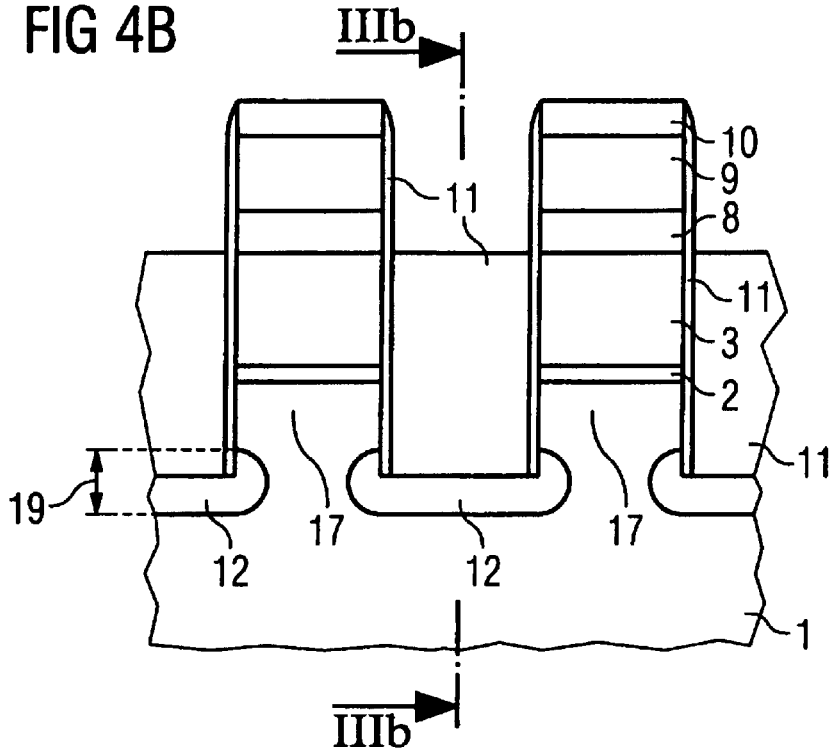

FIGS. 4A and 4B show the cross-sections through the word lines that are indicated in FIGS. 3A and 3B. In the example of FIG. 4A, the etching process has been continued until continuous openings have been formed below the remaining semiconductor channel region 17. In the example shown in FIG. 4B, the etching process was stopped before the etch holes produced from both sides of the word lines occupy the whole region underneath the channel region 17. In the embodiment according to FIG. 4B, the channel region is not totally separated from the semiconductor body. The remaining connection between the semiconductor material of the channel region 17 and the semiconductor body 1, for instance silicon, can provide a sufficient isolation between the channel region and the semiconductor body, since the semiconductor material is depleted of charge carriers. However, a preferred embodiment provides a full isolation underneath the channel region by completely etching through across the total width of the word lines. In this preferred embodiment, there are pn-junctions only between the channel region and the source/drain regions as well as between the source/drain/buried bit line regions and the semiconductor material beneath these regions and/or on lateral sides facing away from the channel, but there are no pn-junctions laterally adjacent to the source/drain regions in the direction of the channel below the channel region.

The maximum thickness 19, i.e., the maximum dimension in the direction orthogonal to the surface of the semiconductor body or semiconductor layer, of the undercut is usually present in the elongation of the plane of the lateral flanks of the word line stack, as indicated in the FIGS.

The upper limit of the area of cover 11 in FIG. 4B shows the position of the upper surface of the bit line stack. The cover 11 can be etched away to expose the surface to thermal oxide growth for providing a passivation.

Figure 5A:
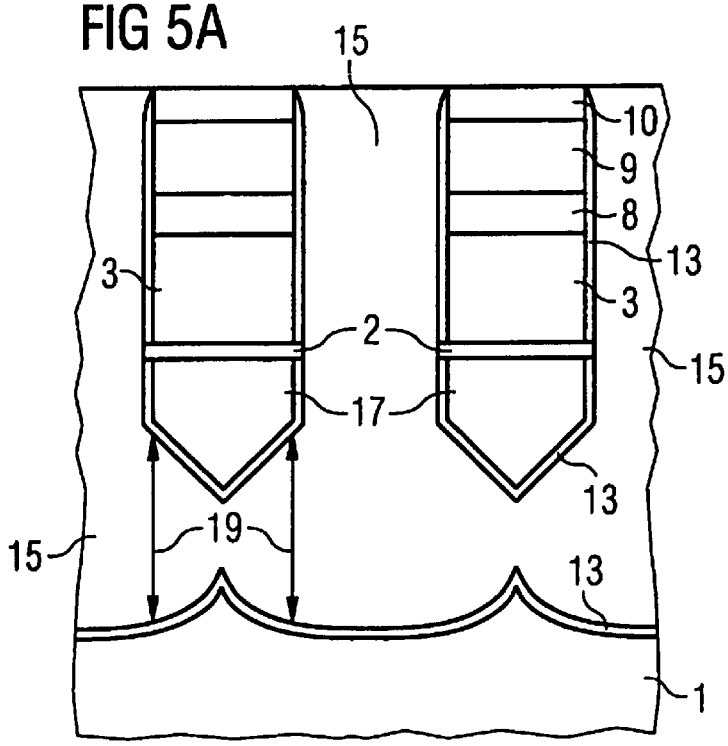
FIGS. 5A and 5B show cross-sections through the word lines according to FIGS. 4A and 4B after subsequent steps of two alternative embodiments of the inventive method.
Figure 5B:
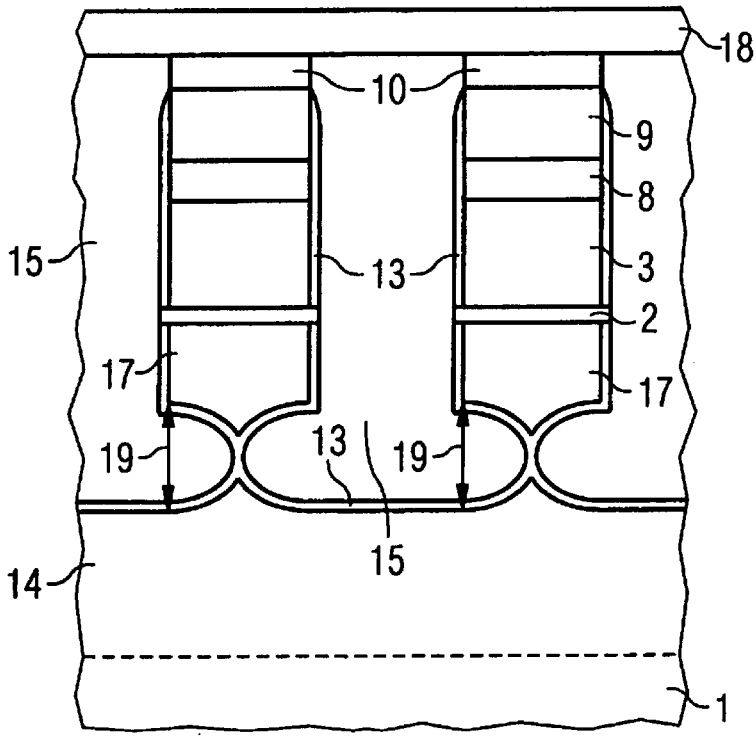

The FIGS. 5A and 5B show cross-sections according to the FIGS. 4A and 4B, respectively, through the word lines after the growth of a thermal oxide cover 13. An electrically insulating material is deposited as fillings 15 to fill up the etch holes and the regions between the word lines up to the level of the hard mask layer 10. The material of the fillings 15 is preferably chosen to have a low value of its relative dielectric constant.

The insulating layer in the undercut beneath the channel region 17 is formed with a maximum thickness 19 of at least 100 nm in the embodiment shown in FIG. 5A. In the embodiment shown in FIG. 5B, the cover 11 (FIG. 4B) has rendered the underetched parts of the etch holes 12 confined to a comparatively smaller vertical extension with a maximum thickness 19 of at least 20 nm.

The FIG. 5B shows optional additional features: a well 14, formed by implanting boron or another dopant to provide p-conductivity regions in order to improve the isolation beneath the channel region 17; a nitride passivation layer 18 applied to the upper surface of the shown structure; and, in this case, a complete isolation of the channel region 17 from the semiconductor body 1 by dielectric material that was formed by thermal oxidation (oxide cover 13).

Figure 6:
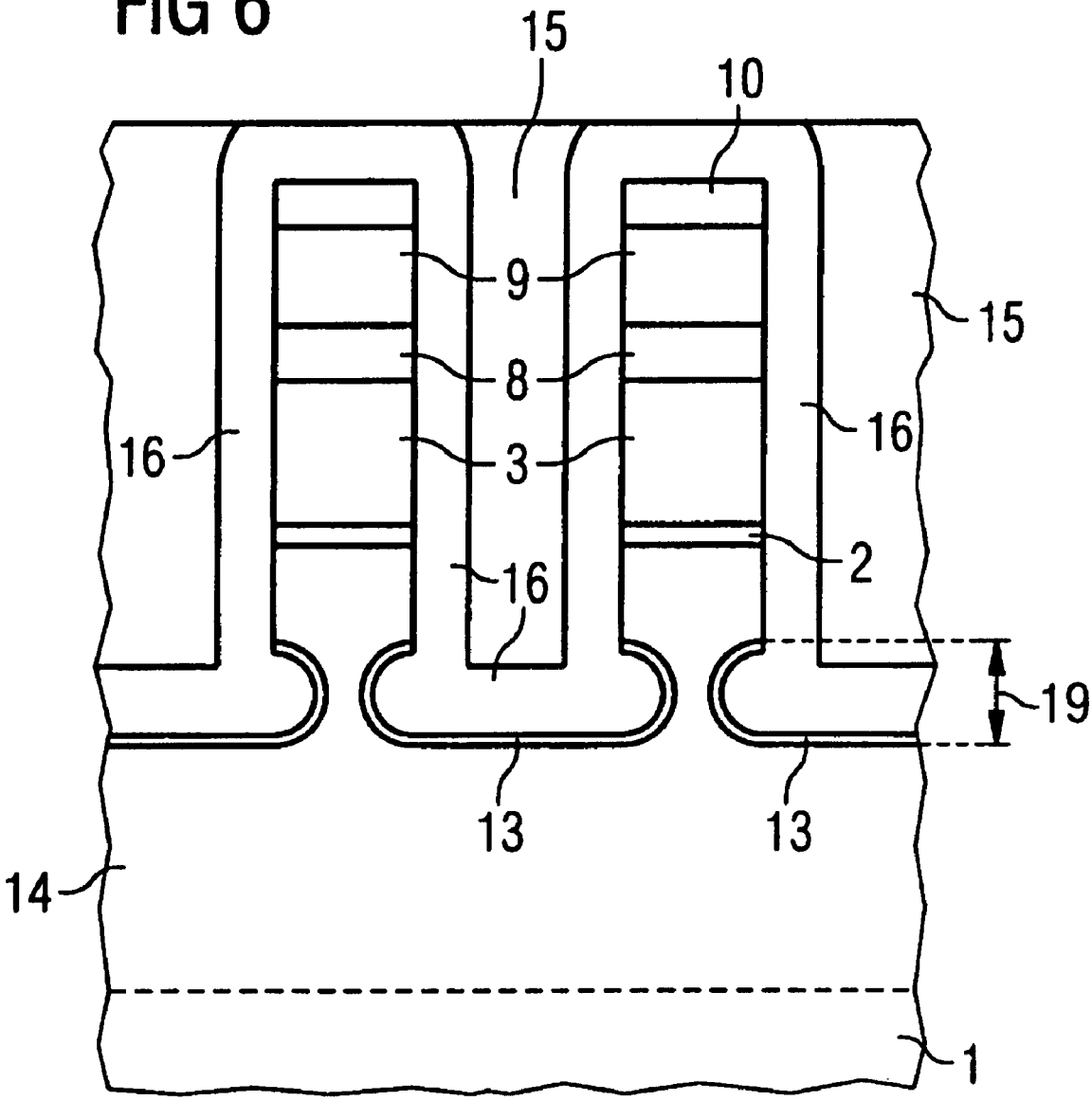
FIG. 6 shows a cross-section through the word lines according to FIG. 5B for a further embodiment.

The FIG. 6 shows the cross-section according to FIG. 5B for a further embodiment in which the growth of the thermal oxide cover was confined to the surfaces of the etch holes, whereas the nitride layer 16 was applied all over the surfaces of the word line stacks. This nitride layer 16 corresponds to the upper nitride passivation layer 18 in FIG. 5B. Such a nitride layer can be used to encapsulate the word line. Thus, a self-aligned contact scheme for the bit lines can be applied.

It will be understood that variations and deviations from the exemplary embodiments of the disclosed method due to special requirements of the manufactured memory devices lie within the scope of this invention.

We claim:

1. A method of producing a non-volatile memory cell with:

a semiconductor structure selected from the group consisting of a semiconductor body and a semiconductor layer and having a surface;

buried bit lines formed at the surface of the semiconductor structure [and conductor strips on the surface applied to the bit lines];

a source region and a drain region each connected by one of the bit lines;

a gate dielectric formed on the surface at least between the source region and the drain region;

a gate electrode disposed on the gate dielectric; and a word line electrically connected to the gate electrode, the word line crossing the bit lines and being electrically insulated from the bit lines;

the method which comprises the following steps:

in a first step, providing a semiconductor structure;

in a second step, depositing a gate dielectric comprising a storage layer for trapping charge carriers;

in a third step, depositing a layer for forming the gate electrode;

in a fourth step, forming openings in the layer and forming spacers at sidewalls in the openings;

in a fifth step, implanting a dopant through the openings to form the buried bit lines;

[in a sixth step, applying the conductor strips onto the buried bit lines, and applying electrically insulating cover layers onto the conductor strips;]

in a [seventh] *sixth* step, applying at least one word line layer electrically connecting the gate electrode, and applying a hard mask layer on top of the at least one word line layer, the hard mask layer being used to structure the gate electrode and the at least one word line layer to form a word line stack;

in [an eighth] *a seventh* step, etching on both sides of the word line stack between the *buried* bit lines anisotropically down into the semiconductor structure to a level below the source region and the drain region to form etch holes that are self-aligned to the word line stack; [and]

in [a ninth] *an eighth* step, filling the etch holes with an electrically insulating material*; and*

*after the step of etching anisotropically to form the etch holes, etching isotropically into the etch holes to form undercuts extending underneath and at a distance to the gate dielectric.*

[2. The method according to claim 1, which further comprises after the step of etching anisotropically to form the etch holes, etching isotropically into the etch holes to form undercuts extending underneath and at a distance to the gate dielectric.]

3. The method according to claim [2] *1*, wherein the isotropic etching is configured such that the undercuts form a continuous opening extending across the word line.

4. The method according to claim [2] *1*, which further comprises, after the step of etching anisotropically to form the etch holes, applying a cover to sidewalls of the word line stack and the etch holes, to protect the sidewalls during isotropic etching.

5. The method according to claim 1, which comprises applying the storage layer as a triple oxide-nitride-oxide layer.

6. A method of producing a non-volatile memory cell, which comprises the following method steps:

providing a semiconductor structure selected from the group consisting of a semiconductor body and a semiconductor layer;

applying a storage layer of dielectric material on a surface of the semiconductor structure;

applying a layer for a gate electrode on the storage layer;

forming openings in the layer and implanting a dopant through the openings to form doped regions provided as buried bit lines and as source and drain;

[applying bit line stacks on the buried bit lines, the bit line stacks each comprising at least one conductor strip;]

forming a word line crossing the bit lines, electrically connecting the word line to the gate electrode and electrically insulating the word line from the bit lines, and structuring the gate electrode;

anisotropically etching into the semiconductor structure between the bit lines on both sides of the word line and thereby using the word line as a mask, thereby forming etch holes; [and]

depositing an electrically insulating material filling the etch holes;

*after the anisotropic etching process, performing a subsequent isotropic etching process into the etch holes, and thereby forming an undercut extending beneath a semiconductor region provided as a channel region; and*

*depositing an electrically insulating material as a filling of the undercut and the etch holes.*

[7. The method according to claim 6, which further comprises:

after the anisotropic etching process, performing a subsequent isotropic etching process into the etch holes, and thereby forming an undercut extending beneath a semiconductor region provided as a channel region; and depositing an electrically insulating material as a filling of the undercut and the etch holes.]

8. The method according to claim [7] *6*, wherein the isotropic etching is configured such that the undercuts form a continuous opening extending across the word line.

9. The method according to claim [7] *6*, which further comprises, after the step of etching anisotropically to form the etch holes, applying a cover to sidewalls of the word line stack and the etch holes, to protect the sidewalls during isotropic etching.

10. The method according to claim 6, which comprises applying the storage layer as a triple oxide-nitride-oxide layer.

11. A non-volatile memory cell, comprising:

a semiconductor structure selected from the group consisting of a semiconductor body and a semiconductor layer and having a surface;

buried bit lines formed at said surface of said semiconductor structure [and conductor strips on said surface applied to said bit lines];

a source region and a drain region each connected by one of said bit lines;

a gate dielectric formed on said surface at least between said source region and said drain region, said gate dielectric including a storage layer for trapping charge carriers;

a gate electrode disposed on the gate dielectric;

a word line electrically connected to said gate electrode, said word line crossing said bit lines and being electrically insulated from said bit lines; [and]

electrically insulating regions extending into said semiconductor structure between said bit lines and on both sides of said word line, said electrically insulating regions being self-aligned to said word line and extending at least to a lower boundary level of said source region and said drain region;

*said electrically insulating regions are formed with an undercut region below said word line at a distance from said gate dielectric and beneath a channel region between said source region and said drain region; and*

*said electrically insulating undercut region at least partly separates said channel region from semiconductor material underneath said channel region and at least partly separates said source region from said drain region.*

[12. The non-volatile memory cell according to claim 11, wherein:

said electrically insulating regions are formed with an undercut region below said word line at a distance from said gate dielectric and beneath a channel region between said source region and said drain region; and said electrically insulating undercut region at least partly separates said channel region from semiconductor material underneath said channel region and at least partly separates said source region from said drain region.]

13. The non-volatile memory cell according to claim [12] *11*, wherein said electrically insulating undercut region extends continuously across said word line.

14. The non-volatile memory cell according to claim [12] *11*, wherein said electrically insulating undercut region has a maximum thickness in a direction orthogonal to the surface of said semiconductor structure of at least 20 nm.

15. The non-volatile memory cell according to claim [12] *11*, wherein said electrically insulating undercut region has a maximum thickness in a direction orthogonal to the surface of said semiconductor structure of at least 100 nm.

16. The non-volatile memory cell according to claim 11, which further comprises a channel region between said source region and said drain region, said channel region having a doping density of at least $10^{17}$ $cm^{-3}$.

*17. The method according to claim 1, which comprises, after the fifth step, applying conductor strips onto the buried bit lines, and applying electrically insulating cover layers onto the conductor strips.*

*18. The method according to claim 6, which comprises applying bit line stacks on the buried bit lines, the bit line stacks each comprising at least one conductor strip.*

*19. The non-volatile memory cell according to claim 11, which comprises conductor strips on said surface applied to said bit lines.*

* * * * *